(12) United States Patent
Choi

(10) Patent No.: US 6,188,254 B1
(45) Date of Patent: Feb. 13, 2001

(54) DATA OUTPUT BUFFER WITH HIGH DRIVABILITY IN SEMICONDUCTOR DEVICE

(75) Inventor: Jung-Kyun Choi, Ichon-shi (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/447,671

(22) Filed: Nov. 23, 1999

(30) Foreign Application Priority Data

Dec. 22, 1998 (KR) .................................................. 98-57300

(51) Int. Cl.[7] ...................................................... H03K 3/00
(52) U.S. Cl. .......................... 327/112; 327/376; 327/378; 326/21; 326/27; 326/82; 326/87
(58) Field of Search ................................... 327/108, 112, 327/374, 376, 377, 378, 379, 382, 384, 387, 391; 326/17, 21, 27, 82, 83, 87, 84, 85, 86

(56) References Cited

U.S. PATENT DOCUMENTS

| | | | |
|---|---|---|---|
| 4,539,494 | 9/1985 | Kurafuji | 365/190 |
| 5,235,219 | * 8/1993 | Cooperman et al. | 326/83 |
| 5,412,315 | 5/1995 | Tsuda | 324/158.1 |
| 5,521,625 | 5/1996 | Morrison | 347/108 |
| 5,748,021 | * 5/1998 | Hunt et al. | 327/312 |

FOREIGN PATENT DOCUMENTS 56-153836   11/1981   (JP) .

* cited by examiner

Primary Examiner—Timothy P. Callahan
Assistant Examiner—An T. Luu
(74) Attorney, Agent, or Firm—Jacobson, Price, Holman & Stern, PLLC

(57) ABSTRACT

Disclosed is a data output buffer improving the drivability, by increasing the power supply voltage and keeping the power supply voltage constant, without being modification and increase of the manufacturing process of the device. Furthermore, the improvement of the drivability may increase the speed of the data output buffer and decrease the chip area. The data output buffer according to the present invention comprises a pull-up transistor coupled to a power supply for providing an output node of the data output buffer with a first voltage level, a pull-down transistor for providing the output node of the data output buffer with a second voltage level, a voltage comparator coupled to the output node for comparing an output signals from the output node with the first voltage level and for amplifying a difference voltage between the output signals from the output node and the first voltage level, and a voltage compensator couple to the voltage comparator for compensating a voltage level of the power supply in response to an output signal from the voltage comparator.

8 Claims, 3 Drawing Sheets

US 6,188,254 B1

DATA OUTPUT BUFFER WITH HIGH DRIVABILITY IN SEMICONDUCTOR DEVICE

FIELD OF THE INVENTION

The present invention relates to a data output buffer; and more particularly, to a data output buffer improving the drivability in semiconductor devices.

DESCRIPTION OF THE PRIOR ART

In general, data output buffers, which output signals from an internal circuit to an external circuit, have been widely used in semiconductor devices and various integration circuits. Accordingly, the data output buffers should have high drivability in order to perfectly output signals from an internal circuit to an external circuit.

FIG. 1 shows a configuration of a conventional data output buffer. In FIG. 1, a pull-up transistor 2 provides an output node 6 with power supply voltage Vddq and a pull-down transistor 4 provides the output node 6 with a ground voltage level GND. The power supply voltage Vddq is a voltage source for the output buffer and the ground voltage level GND is also used for a low voltage level of the output buffer, which are well known to those skilled in the art to which the subject matter pertains. Typically, the pull-up transistor 2 is made up of a PMOS transistor and a pull-down transistor 4 is made up of an NMOS transistor. Further, the output node 6 of the data output buffer is connected to a resistor R and a capacitor C for stabilizing the output signals Dout therefrom. The data output buffer may include separate devices (not shown in FIG. 1) for driving the pull-up and pull-down transistors 2 and 4.

When the pull-up transistor 2 is turned on (while the pull-down transistor 4 is turned off), a high level signal is outputted at the output node 6 and this output signal may corresponds to the power supply voltage Vddq. When the pull-down transistor 4 is turned on (while the pull-up transistor 2 is turned off), a low level signal is outputted at the output node 6 and the low level signal may corresponds to the ground voltage level GND.

However, the conventional data output buffer shown in FIG. 1 has a problem in that a speed delay is caused by the deficiency of the current drivability in the output terminal consisting of the MOS transistors. This reason for such a speed delay is that the voltage applied from the external circuit is used directly. To solve the problem, the threshold voltage of the MOS transistors has been reduced using manufacturing processes. However, the reduction of the threshold voltage based on these manufacturing processes also causes a latch-up problem and the increase of the processing steps.

SUMMARY OF THE INVENTION

It is, therefore, an object of the present invention to provide a data output buffer having a higher drivability of current in semiconductor devices.

It is another object of the present invention to provide a data output buffer increasing its operation speed without increase in processing steps manufacturing integrated circuits.

It is still another object of the present invention to provide a data output buffer applicable to small-sized integrated circuits, such as semiconductor devices.

In accordance with an aspect of the present invention, there is provided a data output buffer in a semiconductor device comprising: a pull-up means coupled to a power supply for providing an output node of the data output buffer with a first voltage level; a pull-down means for providing the output node of the data output buffer with a second voltage level; a voltage comparing and amplifying means coupled to the output node for comparing an output signals from the output node with the first voltage level and for amplifying a difference voltage between the output signals from the output node and the first voltage level; and a voltage compensating means couple to the voltage comparing and amplifying means for compensating a voltage level of the power supply in response to an output signal from the voltage comparing and amplifying means.

In accordance with another aspect of the present invention, there is provided a data output buffer in a semiconductor device comprising: 1) a plurality of output stages, wherein each output stage includes: a) a pull-up means to provide a corresponding output node with a first voltage level; b) a pull-down means to provide the corresponding output node with a second voltage level; and c) a voltage comparing and amplifying means couple to the corresponding output node for comparing the first voltage level with an output signal from the corresponding output node and for amplifying a voltage difference between the first voltage level and the output signal, and 2) a level compensator for compensating the voltage level of the first voltage level in response to an output signal from the voltage comparing and amplifying means in each output stage.

BRIEF DESCRIPTION OF THE DRAWINGS

The accompanying drawings, which are included to provide a further understanding of the present invention and are incorporated in and constitute a part of this specification, illustrate embodiments of the present invention and together with the description serve to explain the concept the present invention, wherein.

DETAILED DESCRIPTION OF THE PREFERRED EMBODIMENTS

Hereinafter, a data output buffer according to the present invention will be described in detail, referring to the accompanying drawings.

Figure 1:
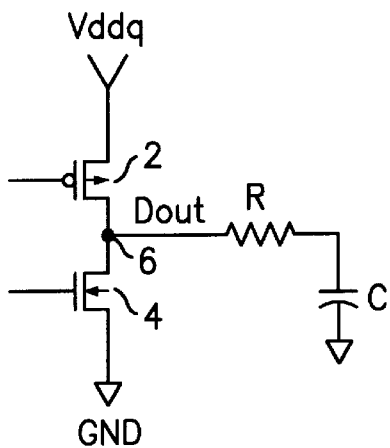
FIG. 1 is a circuit diagram illustrating a conventional data output buffer.
Figure 2:
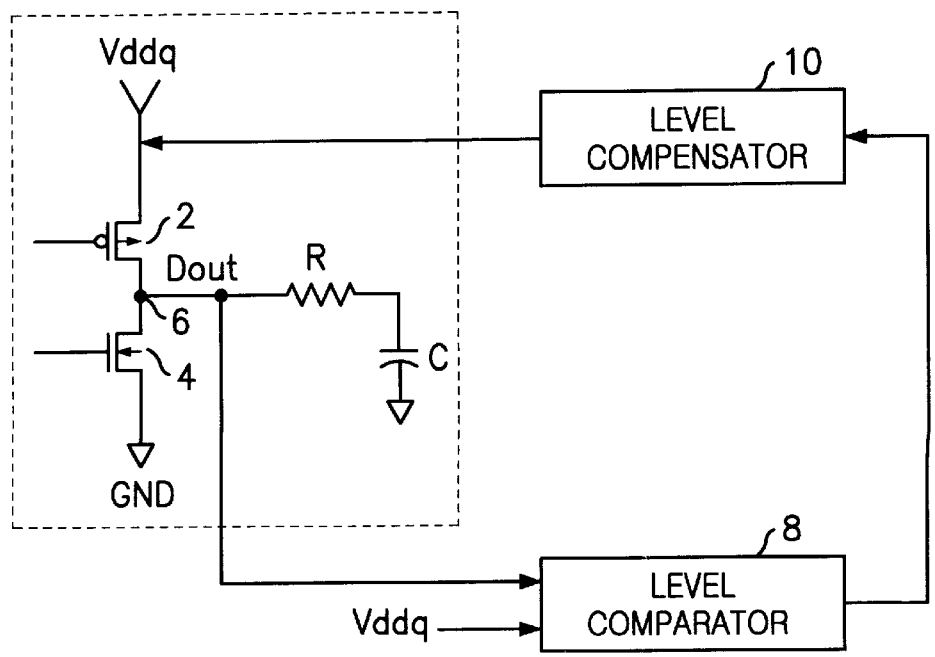
FIG. 2 is a circuit diagram illustrating a data output buffer having a level compensator and a level comparator according to the present invention.

First, elements denoted with the same reference numerals in FIG. 2 are similar to the elements designated with that reference numerals in FIG. 1, and, therefore, are not described in detailed here.

Referring to FIG. 2, the data output buffer according to the present invention includes a pull-up transistor 2 providing power supply voltage Vddq for an output node 6, a pull-down transistor 4 providing a ground voltage level GND for an output node 6, a level comparator 8 coupled to the output node 6 for comparing the voltage signal from the output node with the power supply voltage Vddq and a level compensator 10 coupled to the level comparator 8 for compensating the voltage level of the power supply voltage Vddq in response to the output signal from the level comparator 8. In FIG. 2, the power supply voltage Vddq is a power source for the data output buffer and the ground voltage lever GND is a low voltage source for the data output buffer. In similar to the typical data output buffer in semiconductor devices, the pull-up and pull-down transistors 2 and 4 are made up of PMOS and NMOS transistors, respectively. Also, the data output buffer according to the present invention includes a resistor R and a capacitor C for stabilizing the output signals Dout. Although a driving unit may be included in the pull-up and pull-down transistors 2 and 4 of the data output buffer in FIG. 2 with the various modifications, such a driving unit is not shown in FIG. 2 to simplify explanation of the present invention.

Referring again to FIG. 2, when the power supply voltage Vddq, which is applied from an external circuit, is low, the drivability of the data output buffer is considerably reduced due to the reduction of the threshold voltage of the MOS transistors included therein. Accordingly, to compensate for this reduction of the input voltage, the data output buffer according to the present invention compares the applied voltage (Vddq) with the output signals Dout thereof and, if the output signals Dout is lower than a predetermined value (here, the predetermined value may be the power supply voltage Vddq), the level compensator 10 compensates the power supply voltage Vddq for loss. That is, the data output buffer according to the present invention keeps hold of high drivability, by controlling the voltage level of the power supply voltage Vddq.

The level comparator 8 compares the output signal Dout from the output node 6 with the power supply voltage Vddq from an external circuit and amplifies a difference between the output signal Dout and the power supply voltage Vddq. The level compensator 10 increases the voltage level of the power supply voltage Vddq in response to the voltage difference sensed in the level comparator 8. Of course, the increased voltage on the power supply voltage Vddq is determined based on the voltage difference. Accordingly, the drivability of the data output buffer may be improved.

Figure 3:
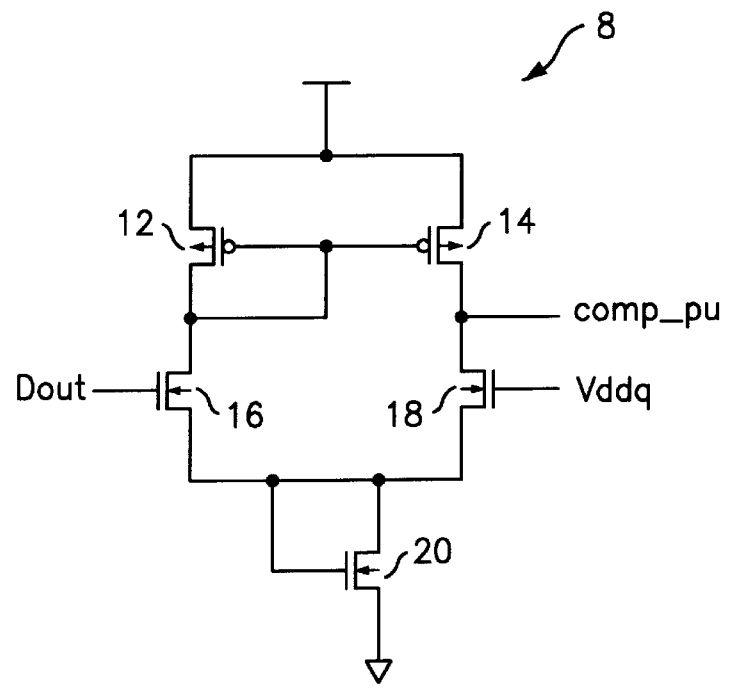
FIG. 3 is a circuit diagram illustrating the level comparator of FIG. 2.

FIG. 3 shows the detailed circuit of the level comparator 8. The level comparator 8 is made up of a difference amplifier in the type of current mirror, which includes five MOS transistors 12, 14, 16, 18 and 20. The output signal Dout of the data output buffer is applied to a first input terminal of the difference amplifier and the power supply voltage Vddq of the data output buffer is applied to a second input terminal of the difference amplifier. As stated above, the level comparator 8 receiving the output signal Dout and the power supply voltage Vddq amplifies the voltage difference two input terminals. It should be noted that the difference amplifier may be employed, besides the current mirror, by other logic circuits amplifying the voltage difference between two input voltage levels.

Figure 4:
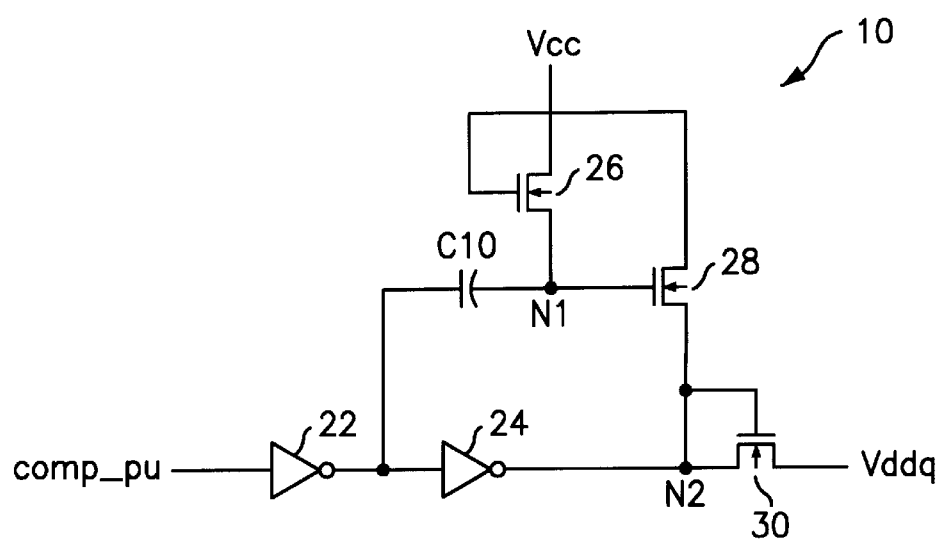
FIG. 4 is a circuit diagram illustrating the level compensator of FIG. 2.

Referring FIG. 4, the level compensator 10 includes a first inverter 22 receiving an output signal comp-pu from the level comparator 8, a second inverter 24 receiving the output signal from the first inverter 22, a pumping circuit for pumping charges on node N1 in response to the output signal from the first inverter 22, a clamping circuit 26 receiving a power supply voltage Vcc for clamping node Ni, a pass transistor 28 coupled between the output terminal of the second inverter 24 and the power supply voltage Vcc, and an output transistor 30 for outputting the voltage on node N2, which is the output terminal of the second inverter 24, in response to an amount of the voltage on node N2. At this time, a gate electrode of the pass transistor 28 is coupled to node N1, the clamping circuit 26 is made up of a MOS transistor formed between the power supply voltage Vcc and node N1, and the gate electrode of the MOS transistor is coupled to the power supply voltage Vcc. In addition, all the transistors shown in FIG. 4 may be made up of NMOS transistors and the level compensator 10 may be modified by other logic circuits to compensate the voltage level of the power supply voltage Vddq using the output signal from the level comparator 8.

Figure 5:
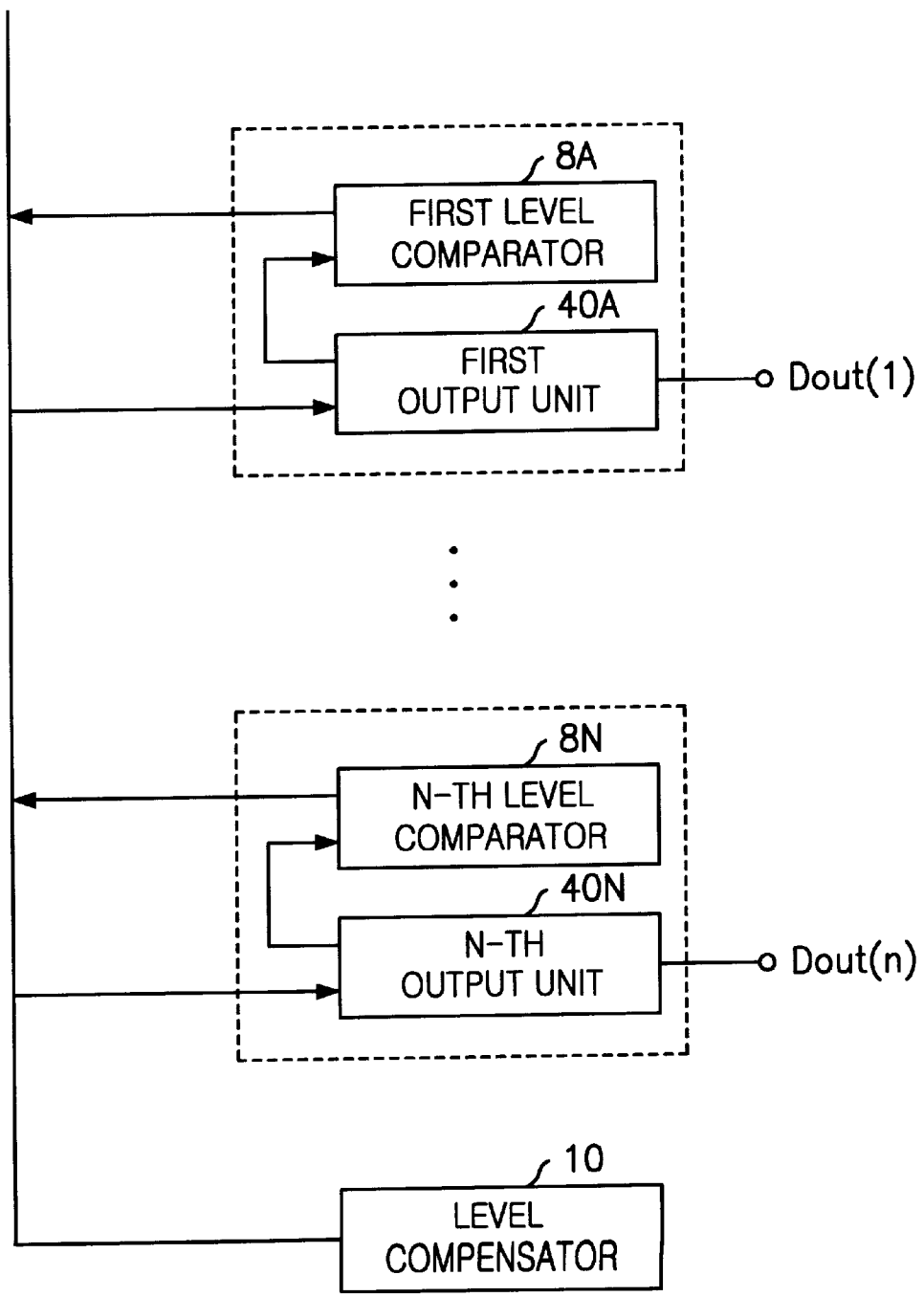
FIG. 5 is a schematic circuit diagram illustrating a buffer block using a plurality of the data output buffers of FIG. 2.

FIG. 5 is a schematic circuit diagram illustrating a buffer block using the data output buffer of FIG. 2. As shown in FIG. 5, a chip includes a buffer block having a plurality of data output buffer as shown in FIG. 2. Particularly, in synchronous memory devices, wide bit memory devices, such as x16, x32 and x36 bit memory devices, output a plurality of data at a time. These multi-bit output may be implemented by the buffer block in FIG. 5. As shown in FIG. 5, the buffer block includes a first output unit 40A having a first pull-up transistor to provide a first output node with a first voltage level and a first pull-down transistor to provide the first output node with a second voltage level and a first level comparator 8A couple to the first output node for comparing the first voltage level with the output signal from the first output node and for amplifying the voltage difference between the first voltage level and the output signal from the first output node. Likewise, the buffer block includes an N-th output unit 40N having an N-th pull-up transistor to provide an N-th output node with a first voltage level and an N-th pull-down transistor to provide the N-th output node with a second voltage level and an N-th level comparator 8N couple to an N-th output node for comparing the first voltage level with the output signal from the N-th output node and for amplifying the voltage difference between the first voltage level and the output signal from the N-th output node. Also, the buffer block includes a level compensator 10 as illustrated in FIG. 2. The level compensator 10 compensates the first voltage level in response to the output of the output signal from each of the level comparators 8A to 8N.

As shown in FIG. 5, since only one compensator is used for a plurality of the level comparators, the data buffer structure according to the present invention may reduces the chip area required to output data with higher drivability.

As described above, the data output buffer according to the present invention has an effect on improvement of the drivability thereof, by increasing the power supply voltage and keeping the power supply voltage constant, without being modification and increase of the manufacturing process of the device. Furthermore, the improvement of the drivability may increase the speed of the data output buffer and decrease the chip area.

It will be apparent to those skilled in the art that various modifications and variations can be made in the data output buffer for the integrated circuits and the semiconductor memory devices of the present invention without departing from the sprit or scope of the present invention. Thus, it is intended that the present invention covers the modifications and variations within the scope of appended claims and their equivalents.

What is claimed is:

1. A data output buffer in a semiconductor device comprising:
   a pull-up means coupled to a power supply for providing an output node of the data output buffer with a first voltage level;
   a pull-down means for providing the output node of the data output buffer with a second voltage level;

a voltage comparing and amplifying means coupled to the output node for comparing an output signals from the output node with the first voltage level and for amplifying a difference voltage between the output signals from the output node and the first voltage level; and a voltage compensating means couple to the voltage comparing and amplifying means for compensating a voltage level of the power supply in response to an output signal from the voltage comparing and amplifying means.

2. The data output buffer in accordance with claim 1, wherein the voltage comparing and amplifying means is a difference amplifier in a type of current mirror.

3. The data output buffer in accordance with claim 1, wherein the voltage compensating means includes a charge pumping means and a clamping means.

4. The data output buffer in accordance with claim 3, wherein the charge pumping means includes a capacitor.

5. A data output buffer in a semiconductor device comprising:
   1) a plurality of output stages, wherein each output stage includes:
      a) a pull-up means to provide a corresponding output node with a first voltage level;
      b) a pull-down means to provide the corresponding output node with a second voltage level; and
      c) a voltage comparing and amplifying means couple to the corresponding output node for comparing the first voltage level with an output signal from the corresponding output node and for amplifying a voltage difference between the first voltage level and the output signal, and
   2) a level compensator for compensating the voltage level of the first voltage level in response to an output signal from the voltage comparing and amplifying means in each output stage.

6. The data output buffer in accordance with claim 5, wherein the voltage comparing and amplifying means is a difference amplifier in a type of current mirror.

7. The data output buffer in accordance with claim 6, wherein the voltage compensating means includes a charge pumping means and a clamping means.

8. The data output buffer in accordance with claim 7, wherein the charge pumping means includes a capacitor.

* * * * *